(12) United States Patent
Park et al.

(10) Patent No.: US 8,228,738 B2
(45) Date of Patent: *Jul. 24, 2012

(54) NAND FLASH MEMORY DEVICE HAVING DUMMY MEMORY CELLS AND METHODS OF OPERATING SAME

(75) Inventors: Ki-Tae Park, Gyeonggi-do (KR);
Jung-Dal Choi, Gyeonggi-do (KR);
Jong-Sun Sel, Gyeonggi-do (KR);
Yoo-Cheol Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/977,419

(22) Filed: Dec. 23, 2010

(65) Prior Publication Data

US 2011/0090738 A1    Apr. 21, 2011

Related U.S. Application Data

(63) Continuation of application No. 12/340,250, filed on Dec. 19, 2008, now Pat. No. 7,881,114, which is a continuation of application No. 11/279,607, filed on Apr. 13, 2006, now Pat. No. 7,480,178.

(30) Foreign Application Priority Data

Apr. 20, 2005  (KR) .............................. 2005-0032829
Mar. 17, 2006  (KR) .............................. 2006-0027595

(51) Int. Cl.
*G11C 16/04* (2006.01)
*G11C 16/06* (2006.01)
*G11C 16/10* (2006.01)

(52) U.S. Cl. ......... 365/185.17; 365/185.18; 365/185.24; 365/185.22; 365/185.29; 365/185.02

(58) Field of Classification Search ............. 365/185.02, 365/185.05, 185.17, 185.18, 185.2, 185.22, 365/185.24, 185.26, 185.29
See application file for complete search history.

(56) References Cited

U.S. PATENT DOCUMENTS 5,589,699 A    12/1996 Araki
(Continued)

FOREIGN PATENT DOCUMENTS

JP    06-275800    9/1994
(Continued)

OTHER PUBLICATIONS

Korean Notice of Allowance and English translation (2 pages) corresponding to Korean Patent Application No. 10-2006-0027595; Mailing Date: Aug. 23, 2007.
(Continued)

*Primary Examiner* — J. H. Hur
(74) *Attorney, Agent, or Firm* — Myers Bigel Sibley & Sajovec, P.A.

(57) ABSTRACT

A NAND flash memory device includes a control circuit configured to apply, during a program operation, a first word line voltage to non-selected ones of a plurality of serially-connected memory cells, a second word line voltage greater than the first word line voltage to a selected one of the plurality of memory cells, and a third word line voltage lower than the first word line voltage to a dummy memory cell connected in series with the plurality of memory cells. In other embodiments, a control circuit is configured to program a dummy memory cell before and/or after each erase operation on a plurality of memory cells connected in series therewith. In still other embodiments, a control circuit is configured to forego erasure of a dummy memory cell while erasing a plurality of memory cells connected in series therewith.

13 Claims, 10 Drawing Sheets

U.S. PATENT DOCUMENTS

| | | | |
|---|---|---|---|
| 5,793,677 A | 8/1998 | Hu et al. | |
| 5,912,489 A | 6/1999 | Chen et al. | |
| 6,009,014 A | 12/1999 | Hollmer et al. | |
| 6,151,249 A | 11/2000 | Shirota et al. | |
| 7,480,178 B2 | 1/2009 | Park et al. | |
| 7,881,114 B2 * | 2/2011 | Park et al. | 365/185.17 |
| 2004/0113199 A1 | 6/2004 | Hazama et al. | |
| 2004/0152262 A1 | 8/2004 | Ichige et al. | |

FOREIGN PATENT DOCUMENTS

| | | |
|---|---|---|
| JP | 2004-127346 | 4/2004 |
| JP | 2004-241558 | 8/2004 |
| KR | 1994-0022569 | 10/1994 |
| KR | 10-1997-0003255 A | 1/1997 |
| KR | 10-2004-0074142 A | 8/2004 |
| KR | 10-2006-0060528 A | 6/2006 |

OTHER PUBLICATIONS

Kanda et al., "A 120mm$^2$ 16Gb 4-MLC NAND Flash Memory with 43nm CMOS Technology", 5 pages, 2008 IEEE International Solid-State Circuit Conference, San Francisco, CA (Feb. 6, 2008).

* cited by examiner

Fig. 1

(PRIOR ART)

Fig. 2

(PRIOR ART)

|        | Read                                  | Erase     | Program                               |
|--------|---------------------------------------|-----------|---------------------------------------|
| BL     | Vbl=0.5V                              | Floating  | PGM ; 0V<br>PGM_Inhibit ; Vcc         |
| SSL    | Vcc                                   | Floating  | Vcc                                   |
| WL     | Select ; Vr<br>Non-Select ; Vread     | 0V        | Select ; Vpgm<br>Non-Select ; Vpass   |
| DWL    | Vread                                 | 0V        | Vpass                                 |
| GSL    | Vcc                                   | Floating  | 0V                                    |
| CSL    | 0V                                    | Floating  | 0V                                    |
| P_Well | 0V                                    | Vera=18V  | 0V                                    |

Fig. 3

(PRIOR ART)

Fig. 4

(PRIOR ART)

| | Read | Erase1 | Erase2 | Erase Verify | Program |
|---|---|---|---|---|---|
| BL | Vbl=0.5V | Floating | Floating | Vbl | PGM ; 0V<br>PGM_Inhibit ; Vcc |
| SSL | Vcc | Floating | Floating | Vcc | Vcc |
| WL | Select ; Vr<br>Non-Select ; Vread | 0V | 0V | 0V | Select ; 18V<br>Non-Select ; 8V |
| DWL | Vread | Floating | 0V | Vread | 3V |
| GSL | Vcc | Floating | Floating | Vcc | 0V |
| CSL | 0V | Floating | Floating | 0V | 0V |
| P Well | 0V | vera=18V | Vera=18V | 0V | 0V |

NAND FLASH MEMORY DEVICE HAVING DUMMY MEMORY CELLS AND METHODS OF OPERATING SAME

CROSS-REFERENCE TO RELATED APPLICATION

This application is a continuation of U.S. patent application Ser. No. 12/340,250, filed Dec. 19, 2008, now U.S. Pat. No. 7,881,114 which is a continuation of U.S. patent application Ser. No. 11/279,607, filed Apr. 13, 2006, now U.S. Pat. No. 7,480,178 which claims priority from Korean Patent Application No. 2005-0032829, filed Apr. 20, 2005, and Korean Patent Application No. 2006-0027595, filed Mar. 17, 2006, the contents of which are hereby incorporated herein by reference in their entirety.

BACKGROUND OF THE INVENTION

The present invention relates to semiconductor memory devices, and more particularly, to NAND flash memory devices.

Generally, a semiconductor memory device is a memory device for storing data and retrieving target data by reading stored data. Semiconductor memory devices may be classified as random access memory (RAM) and read only memory (ROM). RAM is volatile memory that loses stored data when power is interrupted. ROM is nonvolatile memory that holds stored data even when power is interrupted. RAM includes dynamic RAM and a static RAM. ROM includes programmable ROM, erasable ROM, electrically programmable ROM (EPROM), and flash memory. Flash memory devices may be classified as NOR type and NAND type.

Figure 1:
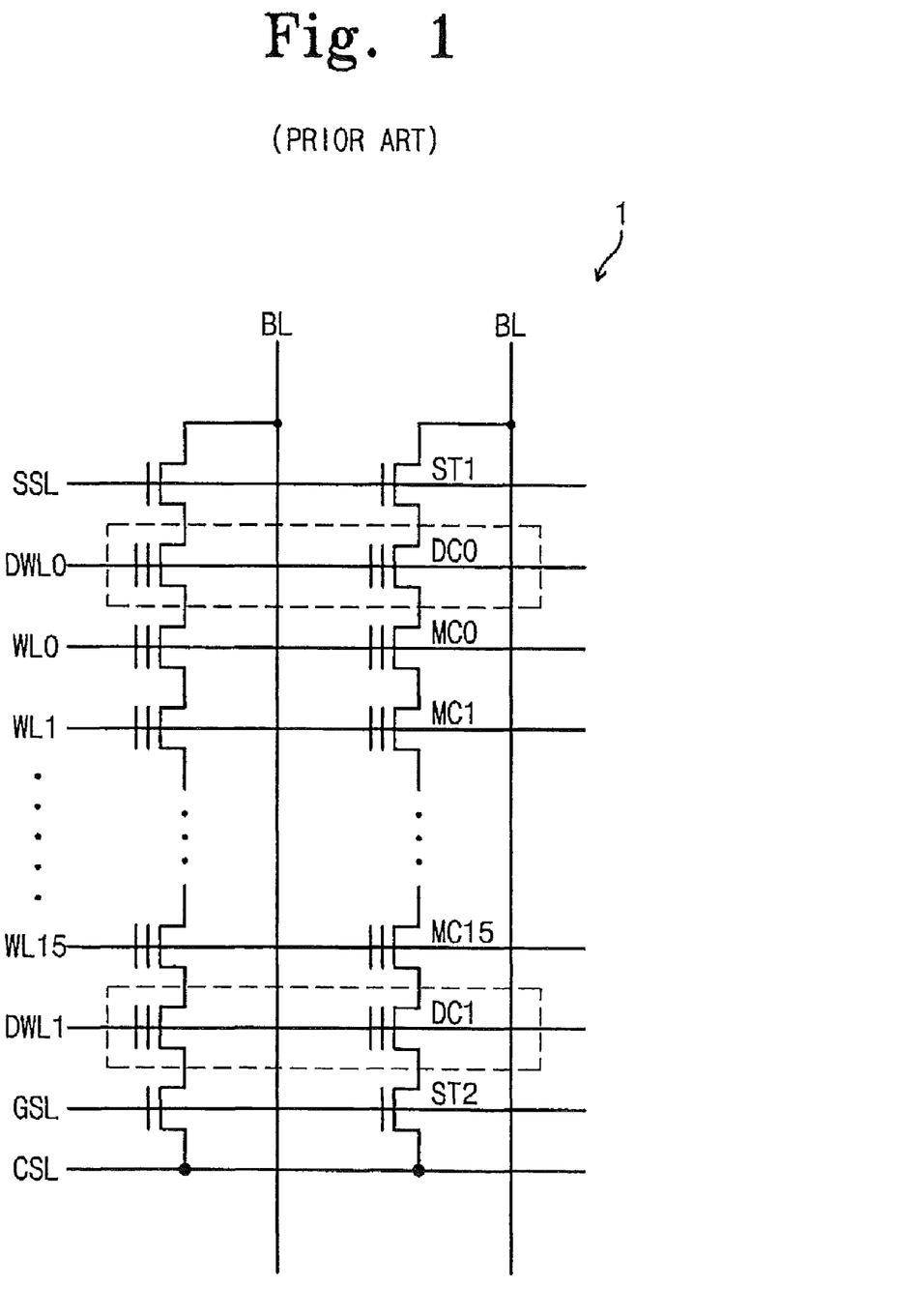
FIG. 1 is a circuit diagram showing a cell string structure of a conventional NAND flash memory.

FIG. 1 is a circuit diagram showing a cell string structure of a conventional NAND flash memory device. The cell string structure 1 of a NAND flash memory device shown in FIG. 1 is described in U.S. Patent Publication No. 2004/0113199.

Referring to FIG. 1, one cell string includes 16 memory cells MC0-MC15 connected in series. Word lines WL0-WL15 are connected to respective gates of the memory cells MC0-MC15. Respective selection transistors ST1 and ST2 connect the cell string to a bit line BL and a common source line CSL. The selection transistor ST1 connected to the bit line BL is called a string selection transistor, and the selection transistor ST2 connected to the common source line CSL is called a ground selection transistor. The gate of the string selection transistor ST1 is connected to a string selection line SSL and the gate of the ground selection transistor ST2 is connected to a ground selection line GSL.

A dummy memory cell DC0 is connected between the string selection transistor ST1 and the memory cell MC0, and another dummy memory cell DC1 is connected between the ground selection transistor ST2 and the memory cell MC15. Gates of the dummy memory cells DC0 and DC1 are connected to respective dummy word lines DWL0 and DWL1. The dummy memory cells DC0 and DC1 have substantially the same structure as the memory cells MC0-MC15. However, the dummy memory cells DC0 and DC1 do not perform program and a read operations, that is, the dummy memory cells DC0 and DC1 are not used as a data storage elements.

Figure 2:
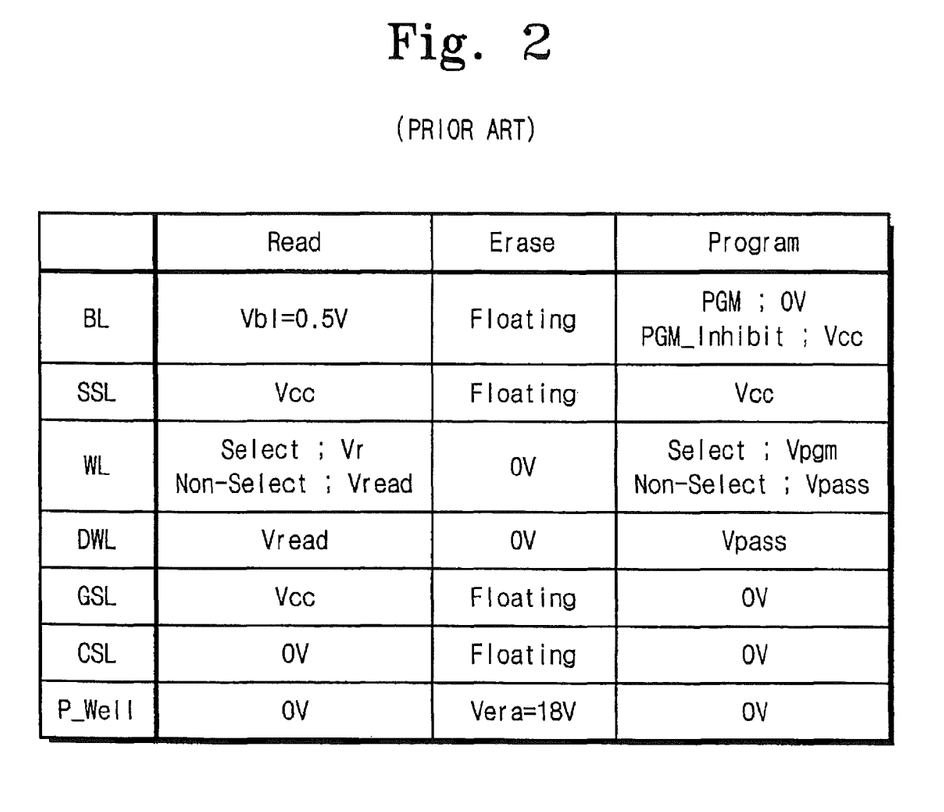
FIG. 2 is a table showing a bias voltage condition for a read, an erase and a program operation for the cell string structure shown in FIG. 1.

FIG. 2 is a table showing bias voltage conditions for read, erase and program operations for the cell string structure shown in FIG. 1. Biasing for the read operation is as follows. The bit line BL is pre-charged by applying 0.5V thereto. A power supply voltage Vcc is applied to the string selection line SSL and the ground selection line GSL. 0V is applied to the common source line CSL. A read voltage is applied to a selected word line and a predetermined voltage is applied to non-selected word lines and the dummy word line to turn on the memory cells. Then, 0V is applied to a P type substrate P_Well of the device.

Biasing for the erase operation is as follows. The bit line BL, the string selection line SSL, the ground selection line GSL and the common source line CSL are placed in a floating state. An erase voltage of 18V is applied to the P type substrate P_Well. Then, 0V is applied to all of the word lines WL and dummy word lines DWL.

Biasing for the program operation is as follows. 0V is applied to a bit line of a memory cell to be programmed. A power supply voltage Vcc is applied to a bit line of cells that are not to be programmed. The power supply voltage Vcc is applied to the string selection line SSL, and 0V is applied to the ground source line GSL and the common source line CSL. The program voltage Vpgm, e.g., 18V, is applied to a selected word line, and a pass voltage Vpass, e.g., 8V, is applied to non-selected word lines. A voltage identical to the pass voltage Vpass is applied to the dummy word lines DWL.

Because 18V is applied to the gate of a cell being programmed and the channel voltage is 0V, a strong electric field is generated between the gate and the channel of the cell being programmed. Electrons in the channel of the programmed cell are injected into the floating gate due to Fowler Nordheim (F-N) tunneling.

An inhibited cell has a gate voltage of 18V and a channel voltage of (power supply voltage Vcc−threshold voltage Vth), where Vth is a threshold voltage of the selection transistor ST1. However, the channel voltage of the inhibited cell increases to about 8V due to a capacitive boosting effect formed between the gate and the channel, that is, an insufficient electric field is generated between the gate and the channel of program inhibit cell to cause F-N tunneling. Therefore, the inhibited cell is not programmed.

Figure 3:
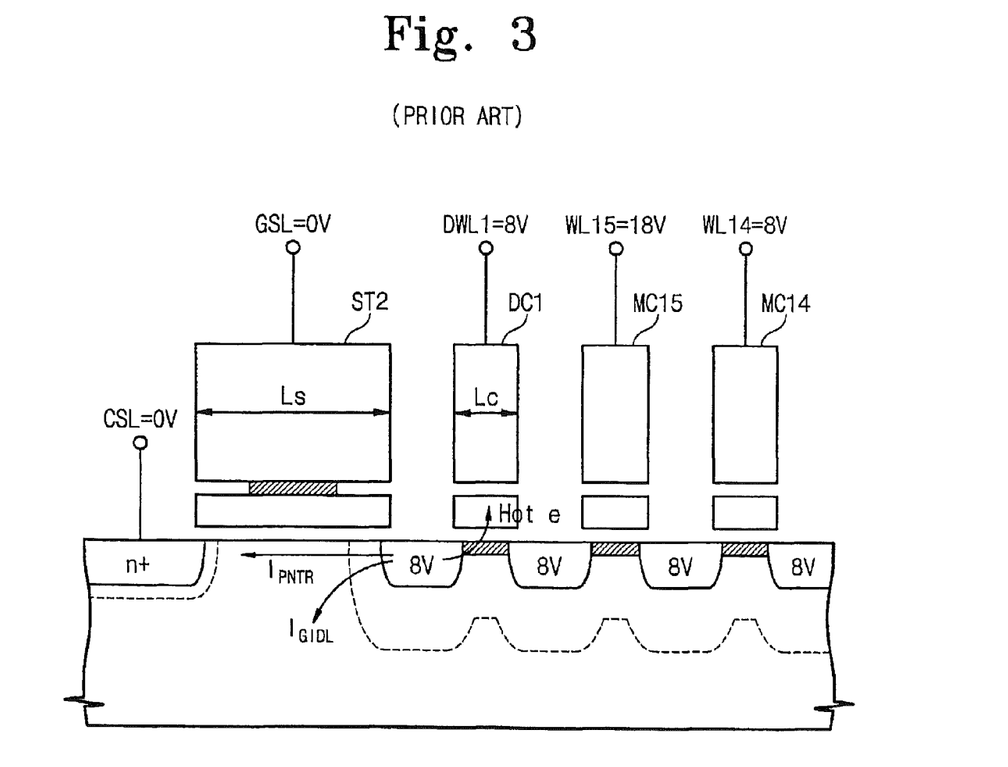
FIG. 3 is a cross-sectional view of the cell string structure shown in FIG. 1 under a bias condition for a program inhibit cell.

FIG. 3 is a cross-sectional view of the cell string structure shown in FIG. 1 under a bias condition for a program inhibit cell. Referring to FIG. 3, 0V is applied to a common source line CSL and a ground selection line GSL, and 18V is supplied to a selected word line WL15. 8V is applied to a non-selected word line WL14 and a dummy word line DWL1. As a result, channel voltages of the memory cells and the dummy memory cell increase to about 8V.

In order to prevent the program inhibit cell from being programmed, it is desirable that the channel voltage increase due to the capacitive boosting effect be substantially maintained. Therefore, 0V is supplied to the ground selection line GSL while programming in order to place the ground selection transistor ST2 in a cut-off state, as shown in FIG. 3. As a result, the channel voltage increase arising from the capacitive boosting effect may be maintained by preventing leakage through the ground selection transistor ST2 while programming.

Although not shown in FIG. 3, such operations may be applied to the string selection transistor ST1. While programming, a power supply voltage Vcc is applied to a bit line BL and a string selection line SSL, and 18V is applied to a selected word line WL0. 8V is applied to a non-selected word line WL1 and a dummy word line DWL0. In this case, channel voltages of the memory cells and the dummy memory cell increase to 8V by the capacitive boosting effect. In order to prevent a program inhibited cell from being programmed, the string selection transistor may be placed in a cut-off state by applying a power supply voltage Vcc to the string selection line SSL while programming. Therefore, the channel voltage increase due to the capacitive boosting effect may be maintained by preventing leakage through the string selection transistor ST1 while performing the program operation.

However, the increased channel voltage of the program inhibit cell may leak due to various factors shown in FIG. 3. When about an 18V program voltage is applied to a selected word line WL15 and about an 8V pass voltage Vpass is applied to a dummy word line DWL1, the drain of the ground selection transistor ST2 has the increased channel voltage of about 8V. If the ground selection transistor ST2 has an insufficient channel length Ls, a leakage current IPNTR may be generated due to punch-through. As a result, the channel voltage may decrease. If the channel voltage decreases due to leakage current, the program inhibit cell may become programmed due to F-N tunneling. In order to prevent the program inhibit cell from being programmed, it is desirable to provide sufficient channel length Ls for the ground selection transistor ST2. However, a long channel may make it difficult to scale down the size of the cell string.

While performing a program operation, the gate voltage of the ground selection transistor ST2 is 0V and the drain voltage is about 8V, which is a relatively high voltage. If a high voltage of about 8V is applied between the drain and the gate of the ground selection transistor ST2, a leakage current IGIDL may flow from a drain region to a substrate region due to gate induced drain leakage (GIDL). The leakage current IGIDL generated by the GIDL may decrease the channel voltage. As a result, the program inhibit cell may be programmed.

Such a problem of programming a program inhibit cell may occur at a memory cell MC0 adjacent to the string selection transistor ST1. While performing the program operation, the gate voltage of string selection transistor ST1 is substantially equal to the power supply voltage Vcc and the drain voltage is about 8V. As a result, a high voltage of about 6 to 8V is applied between the drain and the gate of the string selection transistor ST1. Therefore, leakage current IGIDL may be generated at the string selection transistor ST1.

If about 8V is supplied to the dummy memory cell DC1 and the dummy word line DWL1 and 0V is supplied to the ground selection line GSL, a lateral electric field is formed between the channel of dummy memory cell DC1 and the channel of the ground selection transistor ST2. The lateral electric field generates an electron-hole pair (EHP) between the dummy memory cell DC1 and the ground selection transistor ST2. The electron of the EHP is accelerated to the channel of dummy memory cell DC1. The accelerated electron crashes into a silicon crystal Si, and another EHP is generated by the scattering. Such continuous scattering generates hot electrons, which may be injected to the floating gate of dummy memory cell DC1 by the strong vertical electric field. In this case, the threshold voltage of dummy memory cell DC1 may increase and the program inhibit cell may be programmed.

Figure 4:
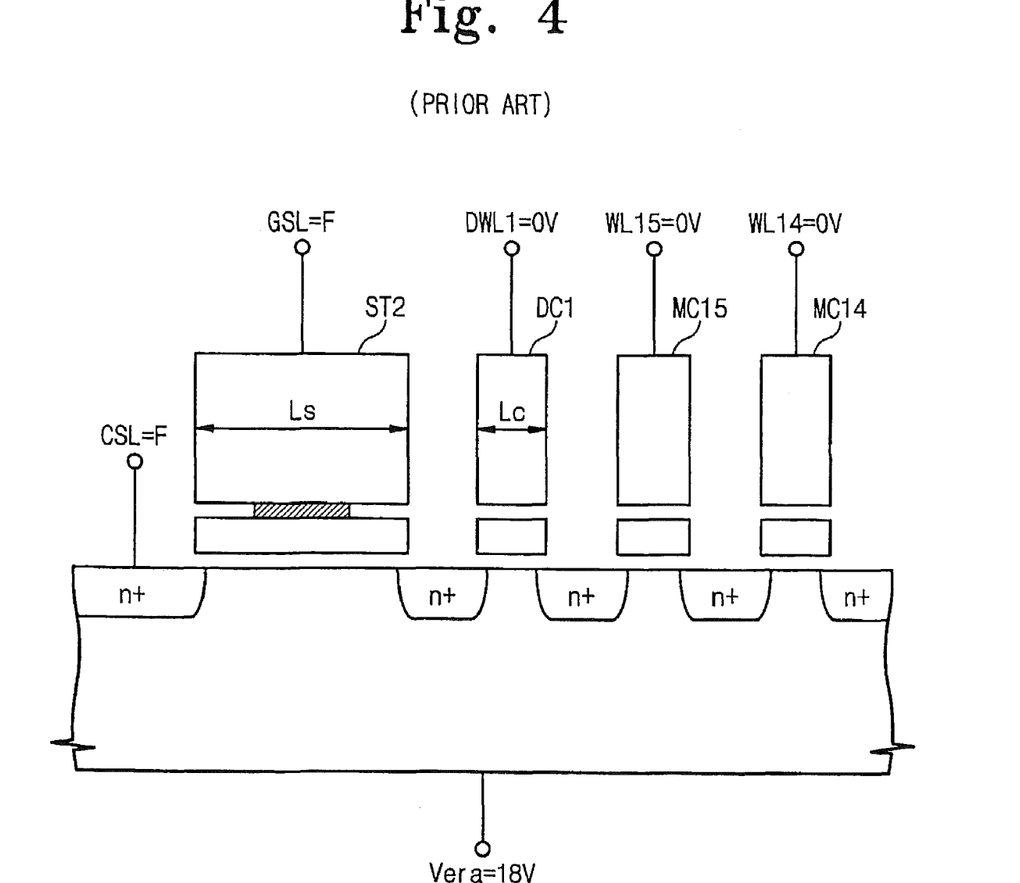
FIG. 4 is a cross-sectional view of the cell string structure shown in FIG. 1 under a bias condition for the erase operation.

FIG. 4 is a cross-sectional view of the cell string structure shown in FIG. 1. FIG. 4 shows a bias voltage condition for the erase operation. While performing the erase operation, a dummy memory cell DC1 is erased with the memory cells MC14, MC15. However, the dummy memory cell DC1 is repeatedly erased, while the memory cells MC14, MC15 are erased and programmed. If erase operations are repeatedly performed on the dummy memory cell, a significant amount of positive charge may accumulate at the floating gate of the dummy memory cell. This may influence a cell current while performing a read operation, a program verification operation and an erase operation and, as a result, programming and erasing characteristics may be degraded.

SUMMARY OF THE INVENTION

In some embodiments of the present invention, a NAND flash memory device includes a plurality of memory cells connected in series, at least one dummy memory cell connected in series with the plurality of memory cells, and a selection transistor connected in series with the dummy memory cell and the plurality of memory cells. The memory device further includes a control circuit configured to apply, during a program operation, a first word line voltage to non-selected ones of the memory cells, a second word line voltage greater than the first word line voltage to a selected memory cell, and a third word line voltage lower than the first word line voltage to the dummy memory cell. The selected memory cell may be a program inhibit cell. The selection transistor may be connected between the dummy memory cell and a bit line, and the control circuit is configured to apply a power supply voltage to the bit line. The selection transistor may be connected between the dummy memory cell and a common source line.

In further embodiments of the present invention, a NAND flash memory device includes a plurality of memory cells connected in series, at least one dummy memory cell connected in series with the plurality of memory cells, and a selection transistor connected in series with the dummy memory cell. The device further includes a control circuit configured to program the dummy memory cell before and/or after erase operations on the plurality of memory cells and the dummy memory cell. The control circuit may be configured to perform an erase verification operation after an erase operation on the plurality of memory cells and the dummy memory cell. The control circuit may be configured to apply, during the erase verification operation, a first erase verify voltage to the memory cells, and a second erase verify voltage greater than the first verify voltage to the dummy memory cell. The first erase verify voltage may be 0V, and the second erase verify voltage may be sufficient to turn on the dummy memory cell while performing an erase verification operation.

In still further embodiments of the present invention, a NAND flash memory device includes a plurality of memory cells connected in series, at least one dummy memory cell connected in series with the plurality of memory cells, and a selection transistor connected in series with the dummy memory cell. The device further includes a control circuit configured not to erase the dummy memory cell while erasing the plurality of memory cells. The control circuit may be configured to float a word line of the dummy memory cell while erasing the plurality of memory cells. The control circuit may be configured to perform an erase verification operation after an erase operation on the plurality of memory cells and the dummy memory cell. The control circuit may be configured to apply, during the erase verification operation, a first erase verify voltage to the memory cells, and a second erase verify voltage greater than the first verify voltage to the dummy memory cell. The first erase verify voltage may be 0V and the second erase verify voltage may be sufficient to turn on the dummy memory cell while performing an erase verification operation.

According to additional embodiments of the present invention, a NAND flash memory device includes a plurality of memory cells connected in series, at least one dummy memory cell connected in series with the plurality of memory cells, and a selection transistor connected in series with the dummy memory cell. The device further includes a control circuit configured to apply, during the erase verification operation, a first erase verify voltage to the memory cells, and a second erase verify voltage greater than the first verify voltage to the dummy memory cell. The first erase verify voltage may be 0V and the second erase verify voltage may be sufficient to turn on the dummy memory cell while performing an erase verification operation.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature, although other materials may be used.

Figure 5:
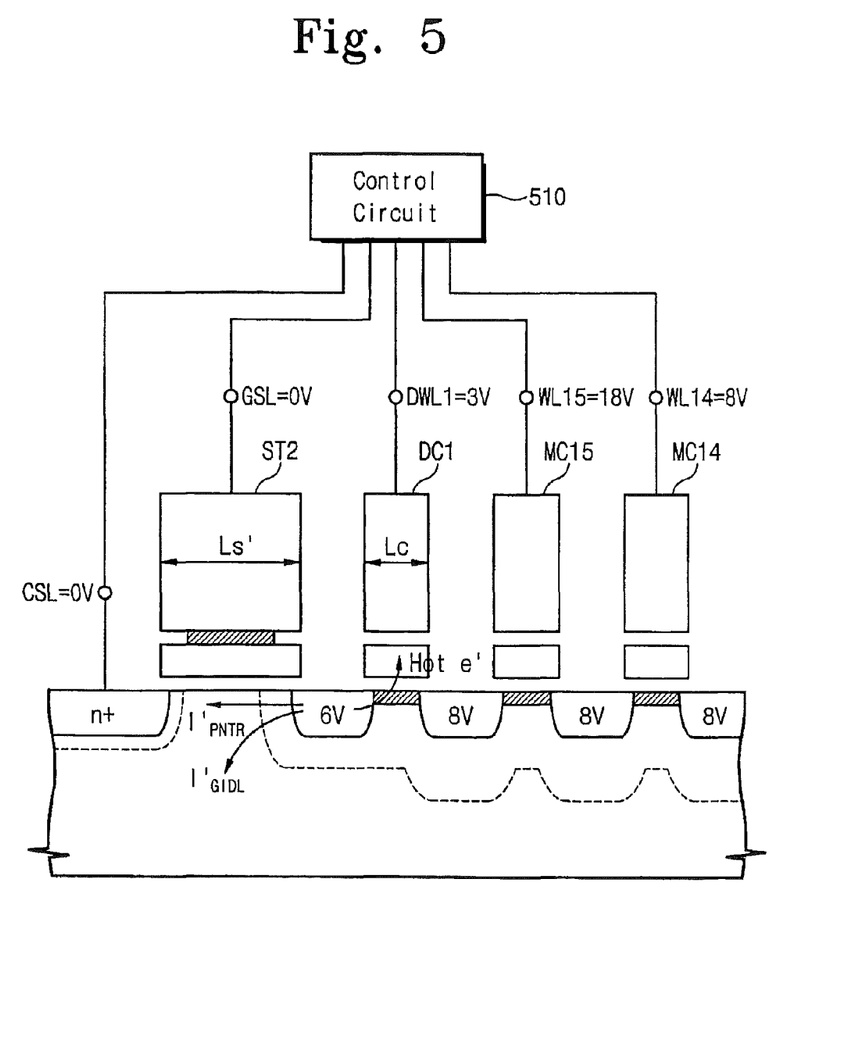
FIG. 5 is a cross-sectional view of a cell string structure of a NAND flash memory device according to some embodiments of the present invention.

FIG. 5 is a cross-sectional view of a cell string structure of a NAND flash memory device according to some embodiments of the present invention, indicating an exemplary bias condition for a program operation controlled by a control circuit 510. For purposes of illustration, the control circuit 510 is conceptually illustrated, but it will be appreciated that, in embodiments of the present invention, the control circuit 510 may be formed on and/or in the same microelectronic substrate as the cell string. The control circuit 510 applies 0V to a common source line CSL for a program inhibit. 0V is applied to a ground selection line GSL in order to place a ground selection transistor ST2 into a cut-off state to reduce channel leakage. About 18V is applied to a selected cell word line WL15 and about 8V is supplied to a non-selected cell word line WL14. A dummy word line voltage, for example, about 3V, is applied to the dummy word line DWL1. The dummy word line voltage is lower than the voltage applied to the non-selected word line WL14. For example, if a threshold voltage of the dummy memory cell WL14 is about −3V, a source voltage of the dummy memory cell DC1 increases to about 6V. As a result, the dummy memory cell DC1 is placed into a cut-off state, that is, the channel voltage of memory cells due to the capacitive boosting effect may not be significantly reduced due to leakage to the source of dummy memory cell DC1.

The channel length Ls' of the ground selection transistor ST2 may be reduced in comparison to the prior art, as the voltage difference between the drain and the source of ground selection transistor ST2 may be reduced compared to the prior art. The leakage current IGTDL' generated by the GIDL may also be reduced, as the voltage difference between the drain and the gate of ground selection transistor ST2 is less than about 6V. Furthermore, a vertical electric field formed between the channel and the gate of the dummy memory cell DC1 may be weakened and the number of hot electrons (Hot e') injected to the floating gate of dummy memory cell DC1 may be reduced.

Such operations may also be applied to the string selection transistor ST1, that is, a voltage lower than the voltage supplied to the non-selected word line may be applied to a dummy word line DWL0 while performing a program operation. Accordingly, the channel length of string selection transistor ST1, the leakage current generated by GIDL, and the number of hot electrons injected to the floating gate of dummy memory cell DC0 may be reduced.

A NAND flash memory device according to some embodiments of the present invention applies a voltage to a dummy word line that is lower than a voltage supplied to non-selected word line while performing a program operation. Therefore, the channel length of selection transistor may be reduced and a program inhibit characteristic may be improved.

Figure 6:
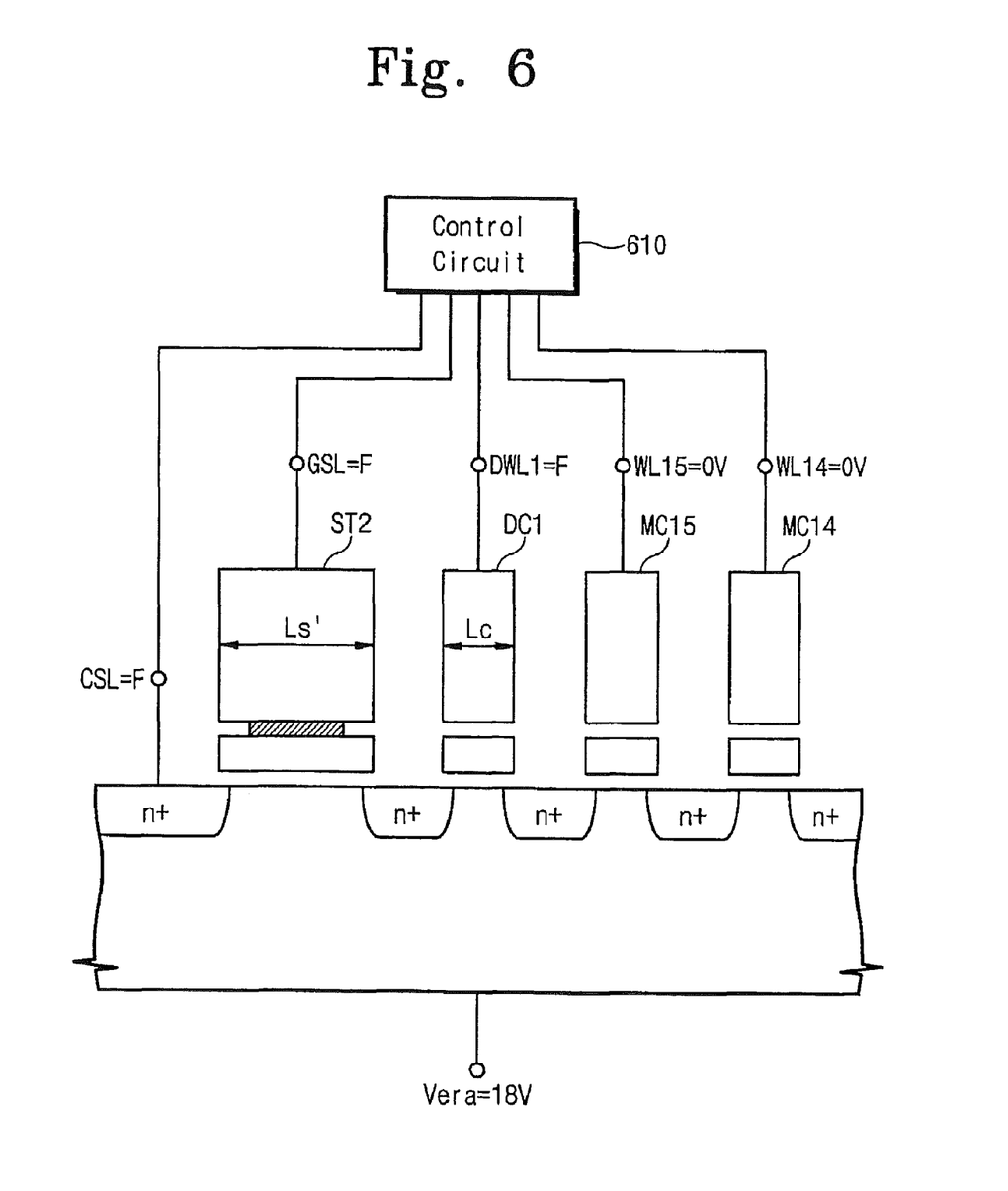
FIG. 6 is a cross-sectional view of a cell string structure of a NAND flash memory device according to some embodiments of the present invention showing a first bias condition for a dummy memory for an erase operation.

FIG. 6 is a cross-sectional view of a cell string structure of a NAND flash memory device according to some embodiments of the present invention showing a first bias condition for a dummy memory for an erase operation controlled by a control circuit 610. For purposes of illustration, the control circuit 610 is conceptually illustrated, but it will be appreciated that, in embodiments of the present invention, the control circuit 610 may be formed on and/or in the same microelectronic substrate as the cell string. The control circuit 610 places a dummy word line DWL1 into a floating state for the erase operation. Therefore, the dummy memory cell DC1 is not erased when the erase operation is performed.

The erase operation is performed in a block unit in the NAND flash memory device. However, an over-erased dummy memory cell problem may arise, because the dummy memory cell may be repeatedly erased without being programmed. In order to prevent the dummy memory from being over-erased, a NAND flash memory device according to some embodiments of the present invention places the dummy word line DWL1 into a floating state while performing an erase operation. The gate of the dummy memory cell DC1 is not erased if 18V is applied to the substrate because the gate of dummy memory cell is in a floating state while the erase operation is performed. Therefore, a NAND flash memory device according to some embodiments of the present invention may reduce degradation of programming and erasing characteristics caused by over-erased dummy memory.

Figure 7:
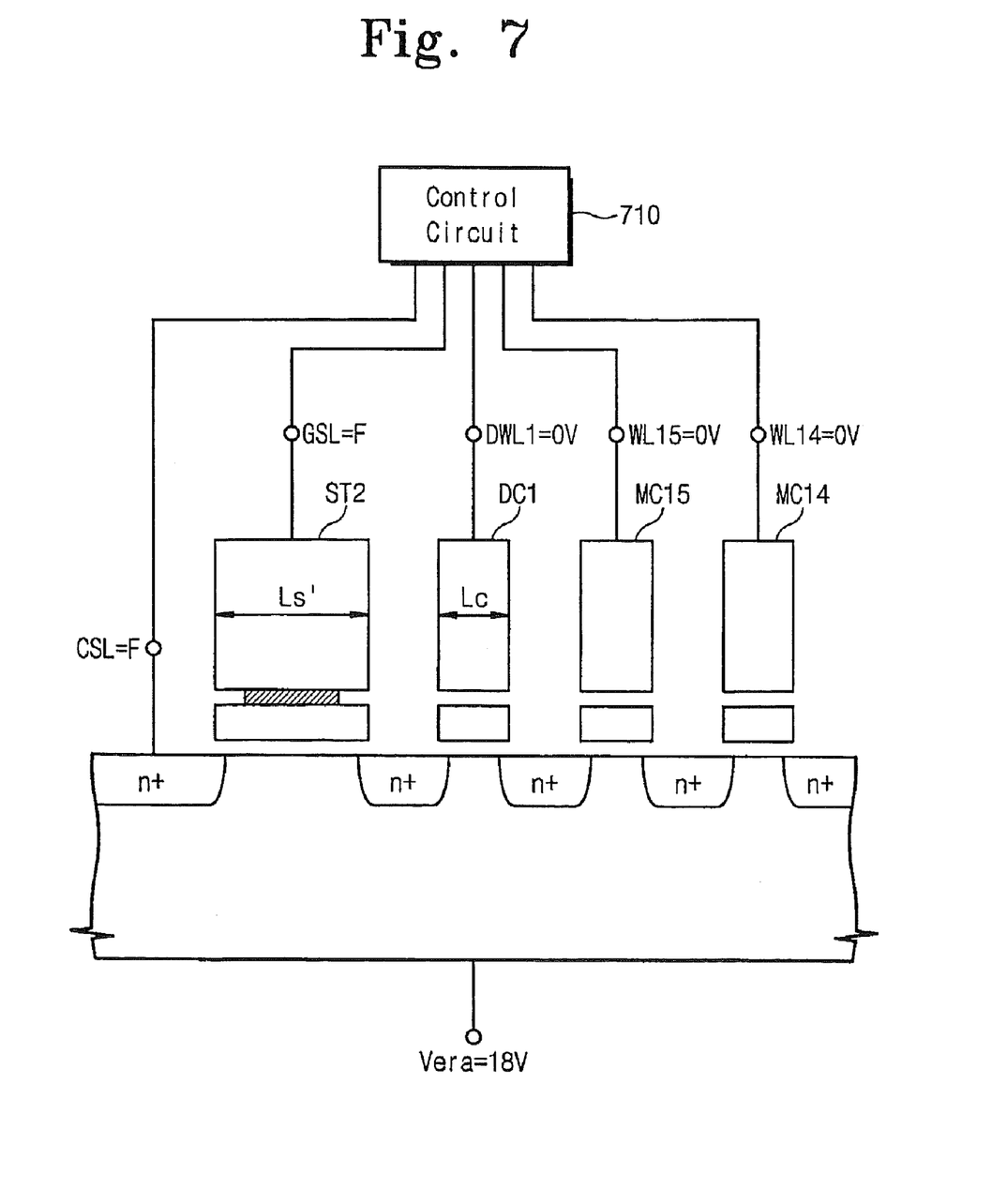
FIG. 7 is a cross-sectional view of a cell storing structure of a NAND flash memory device according to some embodiments of the present invention showing a second bias condition for an erase operation.

FIG. 7 is a cross-sectional view of a cell storing structure of a NAND flash memory device according to some embodiments of the present invention showing a second bias condition for an erase operation controlled by a control circuit 710. For purposes of illustration, the control circuit 710 is conceptually illustrated, but it will be appreciated that, in embodiments of the present invention, the control circuit 710 may be formed on and/or in the same microelectronic substrate as the cell string. The control circuit 710 applies 0V to a dummy word line DWL1 while performing an erase operation. Therefore, the dummy memory cell DC1 is also erased with the other memory cells.

A flash memory device according to some embodiments of the present embodiment may program the dummy memory cell DC1 for the erase operation in order to prevent degradation of characteristics caused by over-erasing of the dummy memory cell DC1. The dummy memory cell DC1 performs a program operation instead of repeatedly performing an erase operation.

Figure 8:
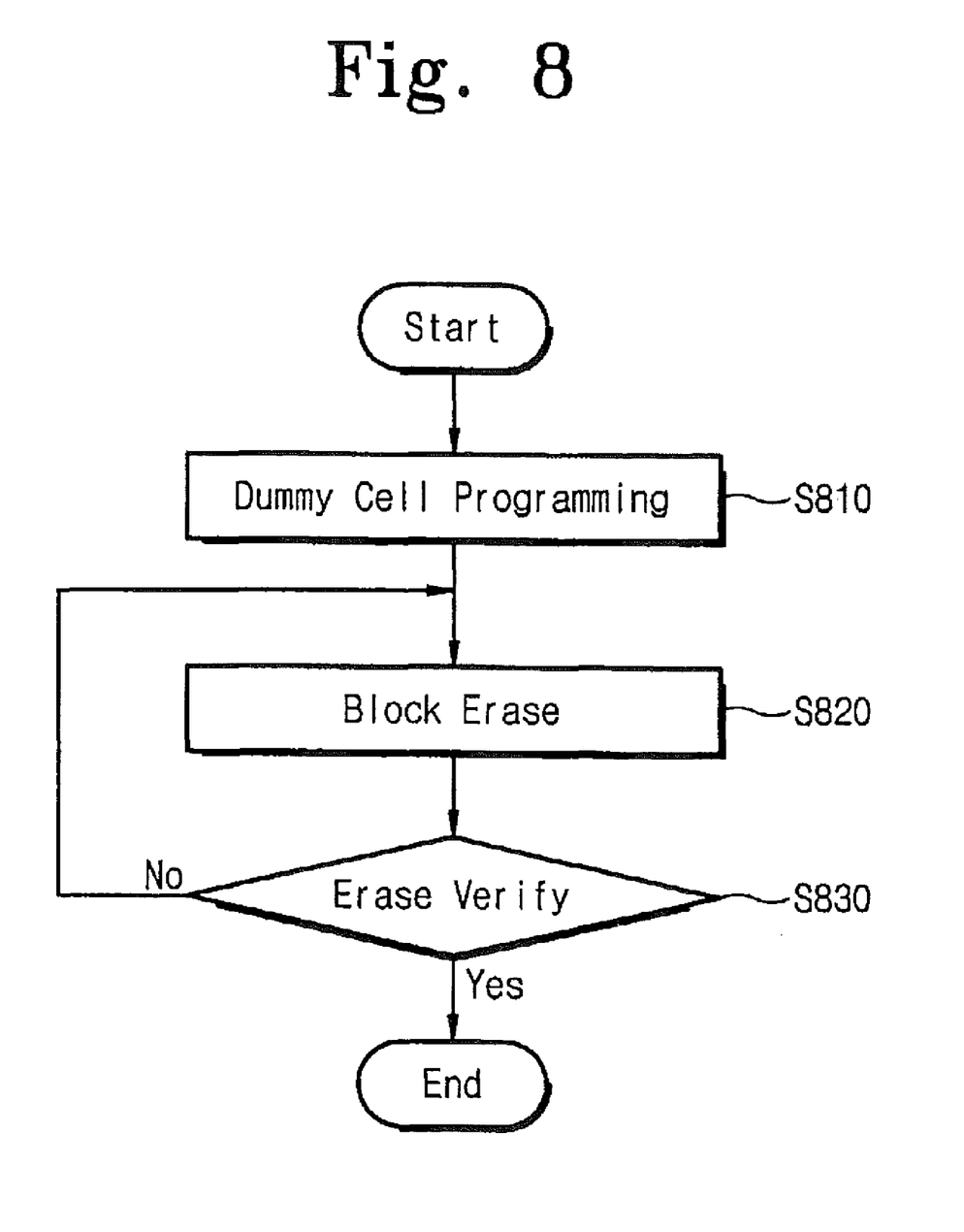
FIG. 8 is a flowchart illustrating programming operations according to some embodiments of the present invention.
Figure 9:
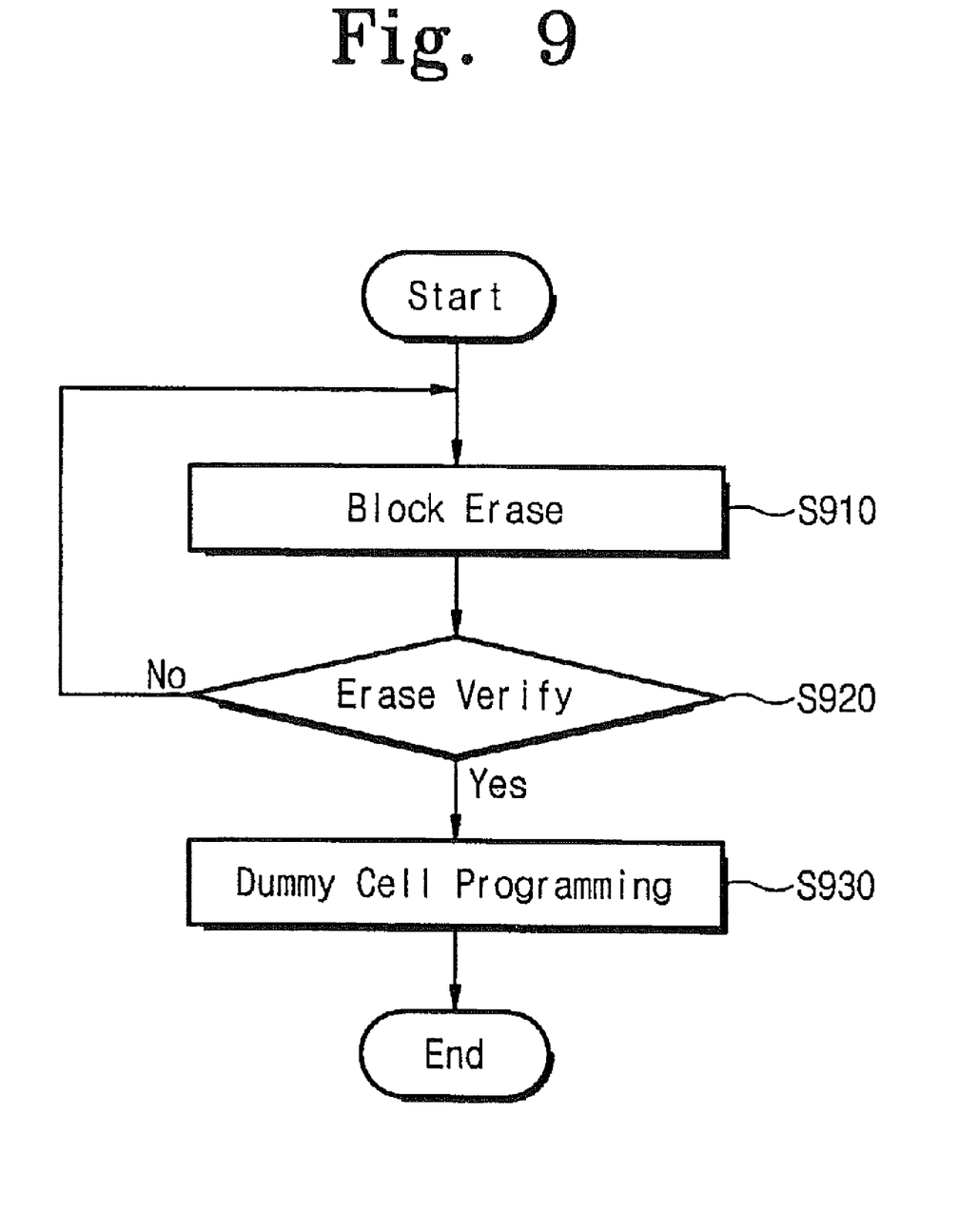
FIG. 9 is a flowchart illustrating programming operations according to further embodiments of the present invention.

FIG. 8 is a flowchart illustrating operations for programming a dummy memory cell before erasing memory cells according to some embodiments of the present invention. FIG. 9 is a flowchart illustrating operations for programming a dummy memory cell after erasing memory cells according to some embodiments of the present invention.

Referring to FIG. 8, a dummy memory cell is programmed in operation S810. After programming, all of memory cells in a block including the dummy memory cell are erased in an operation S820. After erasing the memory cells, an erase verification operation is performed in an operation S830. The block erasing operation is repeatedly performed according to the result of the erase verification operation S830.

Referring to FIG. 9, all of memory cells in a block including the dummy memory cell are erased at the same time in an operation S910. Then, an erase verification operation is performed in an operation S920. If there is a memory cell not erased, the block erase operation is repeatedly performed. If there is no memory cell found that is not erased in the block as a result of verification, the dummy memory cell is programmed in an operation S930.

A NAND flash memory device according to some embodiments of the present invention may prevent the dummy memory cell from being over-erased by programming the dummy memory cell after or before erasing the memory cells. The dummy memory cells are erased with the memory cells during the erase operation. It will be appreciated that the dummy memory cell may be programmed before or after each erase operation, or may be programmed less frequently at a rate sufficient to reduce or prevent overerasing. Therefore, a NAND flash memory device according to some embodiments of the present invention can prevent the degradation of programming and erasing characteristics caused by over-erased dummy memory.

Figure 10:
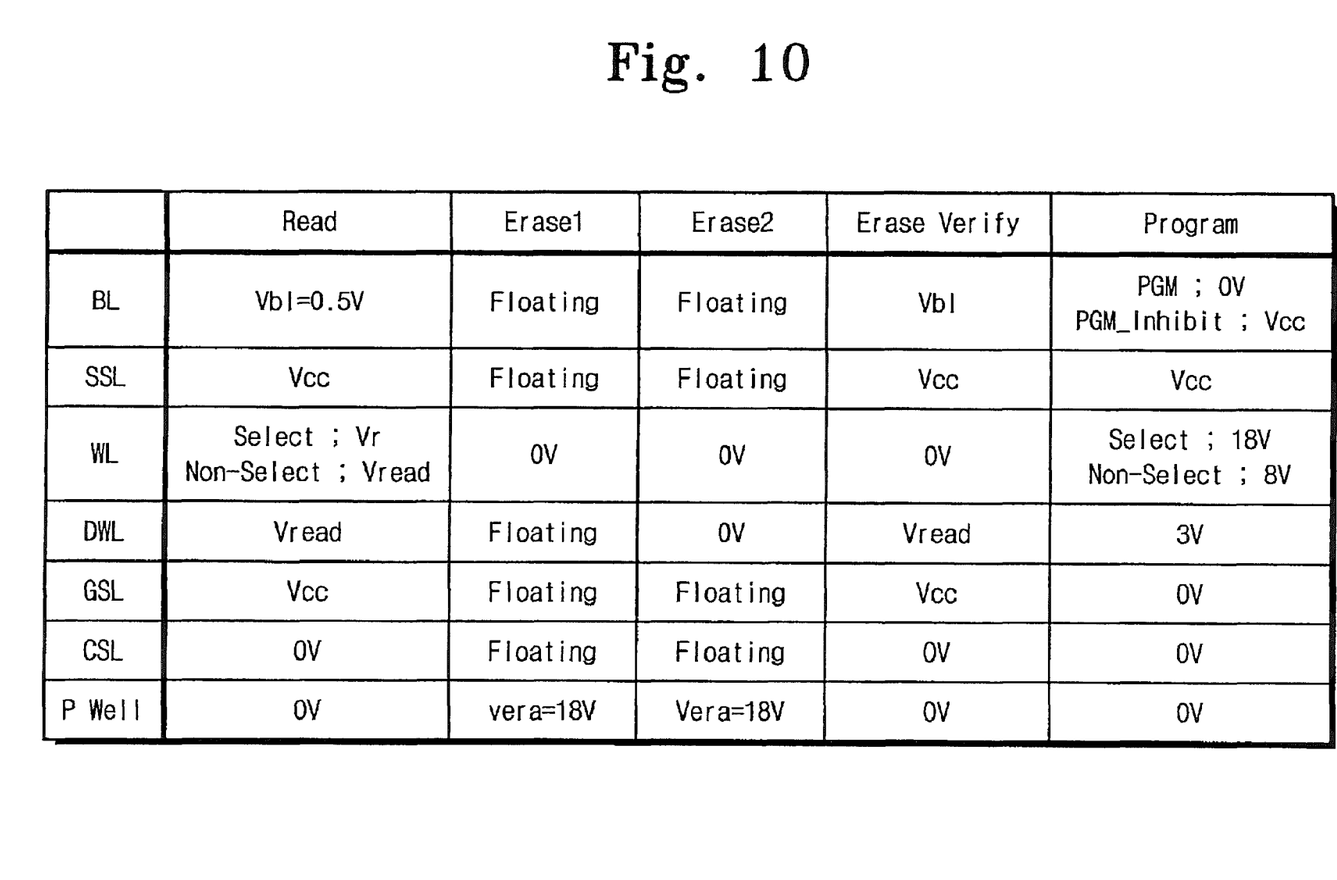
FIG. 10 is a table showing bias conditions for a read operation, an erase operation and a program operation in a NAND flash memory device according to some embodiments of the present invention.

FIG. 10 is a table showing a bias condition for a read operation, two erase operations, an erase verify operation and a program operation in a NAND flash memory device according to further embodiments of the present invention. Referring to FIG. 10, a voltage, e.g., 3V, applied to a dummy word line DWL is lower than a voltage, e.g., 8V, applied to non-selected word line while a program operation is performed. The dummy word line DWL is placed in a floating state according to the first erase bias condition Erase1 for the erase operation. Furthermore, 0V is supplied to the dummy word line DWL according to the second erase bias condition Erase2 for the erase operation. The dummy memory cell is programmed before or after erasing the memory cells.

In the erase verification operation, the bit line BL is precharged by applying Vbl(=0.5V) thereto. A power supply voltage Vcc is applied to the string selection line SSL and the ground selection line GSL. 0V is applied to the common source line CSL and all word lines WL. A predetermined voltage Vread is applied to the dummy word line to turn on the dummy memory cell.

If all of memory cells in a block are erased, memory cells have a negative threshold voltage Vth, e.g., −3V. However, the dummy memory cell DC1 shown in FIG. 7 may have a positive threshold voltage, e.g., 0.5V, due to the effect of the ground selection transistor ST2. Referring to FIG. 7, while performing an erase operation, the ground selection line GSL is placed in a floating state and an erase voltage Vera of 18V is applied to the P type substrate.

Consequently the gate voltage of the ground selection transistor ST2 increases to about 18V due to a capacitive boosting effect formed between the gate and the P type substrate. The increased gate voltage of the ground selection transistor ST2 prevents electrons in a floating gate of the dummy memory cell DC1 from going out to the channel. Thus, the dummy memory cell DC1 can have a positive threshold voltage.

If the threshold voltage of the dummy memory cell DC1 is higher than 0V, even though memory cells MC0~MC15 were erased, the erase verification operation may fail. To turn on the dummy memory cell DC1 while performing an erase verification operation, a turn-on voltage Vread higher than 0V is applied to the dummy word line DWL1.

As described above, a NAND flash memory device according to some embodiments of the present invention applies a voltage to a dummy word line that is lower than a voltage applied to non-selected word line. Therefore, the length of the channel of selection transistor may be reduced and program inhibit characteristics may be improved.

In addition, a NAND flash memory device according to some embodiments of the present invention places a dummy word line in a floating state while performing an erase operation, or programs the dummy memory cell before or after erasing memory cells so that over-erasing of the dummy memory cell maybe prevented. Therefore, a NAND flash memory device according to some embodiments of the present invention may prevent degradation of programming and erasing characteristics caused by over-erased dummy memory while performing a read operation, the program verification operation and the erase verification operation.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A NAND flash memory device comprising:
a plurality of memory cells connected in series;
at least one dummy memory cell connected in series with the plurality of memory cells; and
a control circuit configured to perform a program operation on the dummy memory cell after an erase operation on the plurality of memory cells and the dummy memory cell.

2. The NAND flash memory device of claim 1, wherein the control circuit is configured to perform an erase verification operation on the plurality of memory cells and the dummy memory cell between the erase operation and the program operation.

3. The NAND flash memory device of claim 2, wherein the control circuit is configured to apply, during the erase verification operation, a first erase verify voltage to the plurality of memory cells, and a second erase verify voltage greater than the first verify voltage to the dummy memory cell.

4. The NAND flash memory device of claim 3, wherein the first erase verify voltage is 0V.

5. The NAND flash memory device of claim 3, wherein the second erase verify voltage is sufficient to turn on the dummy memory cell while performing the erase verification operation.

6. A NAND flash memory device comprising:
a plurality of memory cells connected in series;
a ground selection transistor connected in series with the plurality of memory cells;
a string selection transistor connected in series with the plurality of memory cells;
at least one dummy memory cell connected in series with the plurality of memory cells, the ground selection transistor and the string selection transistor; and
a control circuit configured not to erase the dummy memory cell during an erase operation on the plurality of memory cells.

7. The NAND flash memory device of claim 6, wherein the control circuit is configured to apply, during a program operation, a first word line voltage to non-selected ones of the memory cells,
a second word line voltage greater than the first word line voltage to a selected memory cell, and
a third word line voltage lower than the first word line voltage to the dummy memory cell.

8. A NAND flash memory device comprising:
a plurality of memory cells connected in series;
at least one dummy memory cell connected in series with the plurality of memory cells; and
a control circuit configured not to erase the dummy memory cell during an erase operation on the plurality of memory cells, wherein the control circuit is configured to float a word line of the dummy memory cell while erasing the plurality of memory cells.

9. A NAND flash memory device comprising:
a plurality of memory cells connected in series;
at least one dummy memory cell connected in series with the plurality of memory cells; and
a control circuit configured not to erase the dummy memory cell during an erase operation on the plurality of memory cells, wherein the control circuit is configured to perform an erase verification operation on the plurality of memory cells and the dummy memory cell after the erase operation.

10. The NAND flash memory device of claim 9, wherein the control circuit is configured to apply, during the erase verification operation, a first erase verify voltage to the plurality of memory cells, and a second erase verify voltage greater than the first verify voltage to the dummy memory cell.

11. The NAND flash memory device of claim 10, wherein the first erase verify voltage is 0V.

12. The NAND flash memory device of claim 10 wherein the second erase verify voltage is sufficient to turn on the dummy memory cell while performing the erase verification operation.

13. A NAND flash memory device comprising:
a plurality of memory cells connected in series;
at least one dummy memory cell connected in series with the plurality of memory cells; and
a control circuit configured to float a word line of the dummy memory cell while erasing the plurality of memory cells.

* * * * *